United States Patent
Rutkowski et al.

(10) Patent No.: US 12,494,776 B2
(45) Date of Patent: Dec. 9, 2025

(54) DUTY CYCLE CORRECTION

(71) Applicant: QUALCOMM Incorporated, San Diego, CA (US)

(72) Inventors: Joseph Dale Rutkowski, Chandler, AZ (US); Liangguo Shen, San Diego, CA (US); Milind Sawant, Morgan Hill, CA (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 18/425,515

(22) Filed: Jan. 29, 2024

(65) Prior Publication Data

US 2025/0247085 A1   Jul. 31, 2025

(51) Int. Cl.
| | |
|---|---|
| *H03K 9/08* | (2006.01) |
| *H03K 5/14* | (2014.01) |
| *H03K 7/08* | (2006.01) |
| *H03L 7/091* | (2006.01) |

(52) U.S. Cl.
CPC .................. *H03K 7/08* (2013.01); *H03K 5/14* (2013.01); *H03L 7/091* (2013.01)

(58) Field of Classification Search
CPC ............ H05B 41/3927; H05B 41/2827; H03K 5/1565; H03K 7/08; H03K 3/071; H03K 3/017; H03K 5/135; H02M 7/5395; H02M 1/0003
USPC ......................................................... 375/238
See application file for complete search history.

(56) References Cited

U.S. PATENT DOCUMENTS

| | | | |
|---|---|---|---|
| 2007/0139103 A1* | 6/2007 | Roeckner ................ | H03F 1/305 330/10 |
| 2012/0250426 A1* | 10/2012 | Huang .................. | G11C 7/1066 365/189.11 |
| 2013/0106308 A1* | 5/2013 | Sun ........................ | H05B 45/37 315/297 |
| 2018/0158289 A1* | 6/2018 | Vasilev ................... | H03L 7/099 |
| 2020/0328711 A1* | 10/2020 | Mortazav .............. | B06B 1/0246 |
| 2021/0200257 A1* | 7/2021 | Huang .................. | H03K 3/0315 |
| 2023/0179099 A1* | 6/2023 | Archibald ........... | H02M 3/1586 |
| 2024/0402812 A1* | 12/2024 | Dementyev ............ | G04G 21/08 |
| 2025/0025077 A1* | 1/2025 | Tehrani ................ | A61B 5/0538 |

* cited by examiner

*Primary Examiner* — Khai Tran
(74) *Attorney, Agent, or Firm* — QUALCOMM Incorporated

(57) ABSTRACT

In some aspects, a device may comprise a digital modulator to generate a first pulse width modulation (PWM) signal. The device may comprise a first power stage component to generate a first output PWM signal based on the first PWM signal. The device may comprise a first sampling component to sample the first output PWM signal and generate a first sampled output PWM signal. The device may comprise a first adjustment signal generator to generate a first duty cycle adjustment signal based on the first PWM signal and the first sampled output PWM signal. The device may comprise a first PWM adjustment component to adjust a duty cycle of the first PWM signal based on the first duty cycle adjustment signal in association with correcting a duty cycle of the first output PWM signal to generate a corrected first PWM signal. Numerous other aspects are described.

20 Claims, 7 Drawing Sheets

DUTY CYCLE CORRECTION

FIELD OF THE DISCLOSURE

Aspects of the present disclosure generally relate to duty cycle correction and, for example, to duty cycle correction for a driver circuit.

BACKGROUND

A driver circuit may generate a pair of differential signals used to drive another circuit component. For example, in a haptics application, a driver circuit may be configured to generate a pair of pulse width modulation (PWM) signals that can be used to drive a linear resonant actuator (LRA). In one example, a driver circuit comprises a digital modulator (e.g., such as a third order delta-sigma modulator with 4-bit digital PWM) that generates a pair of PWM signals, and the pair of PWM signals are provided to respective high voltage power stages to generate a pair of output PWM signals that are provided to the LRA.

SUMMARY

In some aspects, a device includes a digital modulator to generate a first pulse width modulation (PWM) signal; a first power stage component to generate a first output PWM signal based on the first PWM signal; a first sampling component to sample the first output PWM signal and generate a first sampled output PWM signal; a first adjustment signal generator to generate a first duty cycle adjustment signal based on the first PWM signal and the first sampled output PWM signal; and a first PWM adjustment component to adjust a duty cycle of the first PWM signal based on the first duty cycle adjustment signal in association with correcting a duty cycle of the first output PWM signal to generate a corrected first PWM signal.

In some aspects, a method includes generating, by a first adjustment signal generator of a driver circuit, a first duty cycle adjustment signal based on a first PWM signal and a first sampled output PWM signal, wherein the first PWM signal is generated by a digital modulator of the driver circuit, and wherein the first sampled output PWM signal is generated based on a first output PWM signal that is generated by a first power stage component of the driver circuit based on the first PWM signal; and adjusting, by a first PWM adjustment component of the driver circuit, a duty cycle of the first PWM signal based on the first duty cycle adjustment signal, wherein the adjustment of the duty cycle of the first PWM signal is associated with correcting a duty cycle error in the first output PWM signal to generate a corrected first PWM signal.

In some aspects, a driver circuit includes a digital modulator to generate a PWM signal; a first level shifter to apply a level shift to the PWM signal to generate a first level-shifted PWM signal; a power stage component to generate an output PWM signal based on the first level-shifted PWM signal; a second level shifter and sampler to reverse the level-shift applied by the first level shifter and sample the output PWM signal to generate a sampled output PWM signal; an adjustment signal generator to generate a duty cycle adjustment signal based on a difference in a pulse width of the PWM signal and a pulse width of the sampled output PWM signal; and a PWM adjustment component to adjust a duty cycle of the PWM signal based on the duty cycle adjustment signal, wherein the adjustment of the duty cycle of the PWM signal is to reduce an error in a duty cycle of the output PWM signal to generate a corrected PWM signal.

Aspects generally include a method, apparatus, system, computer program product, non-transitory computer-readable medium, user device, user equipment, wireless communication device, and/or processing system as substantially described with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
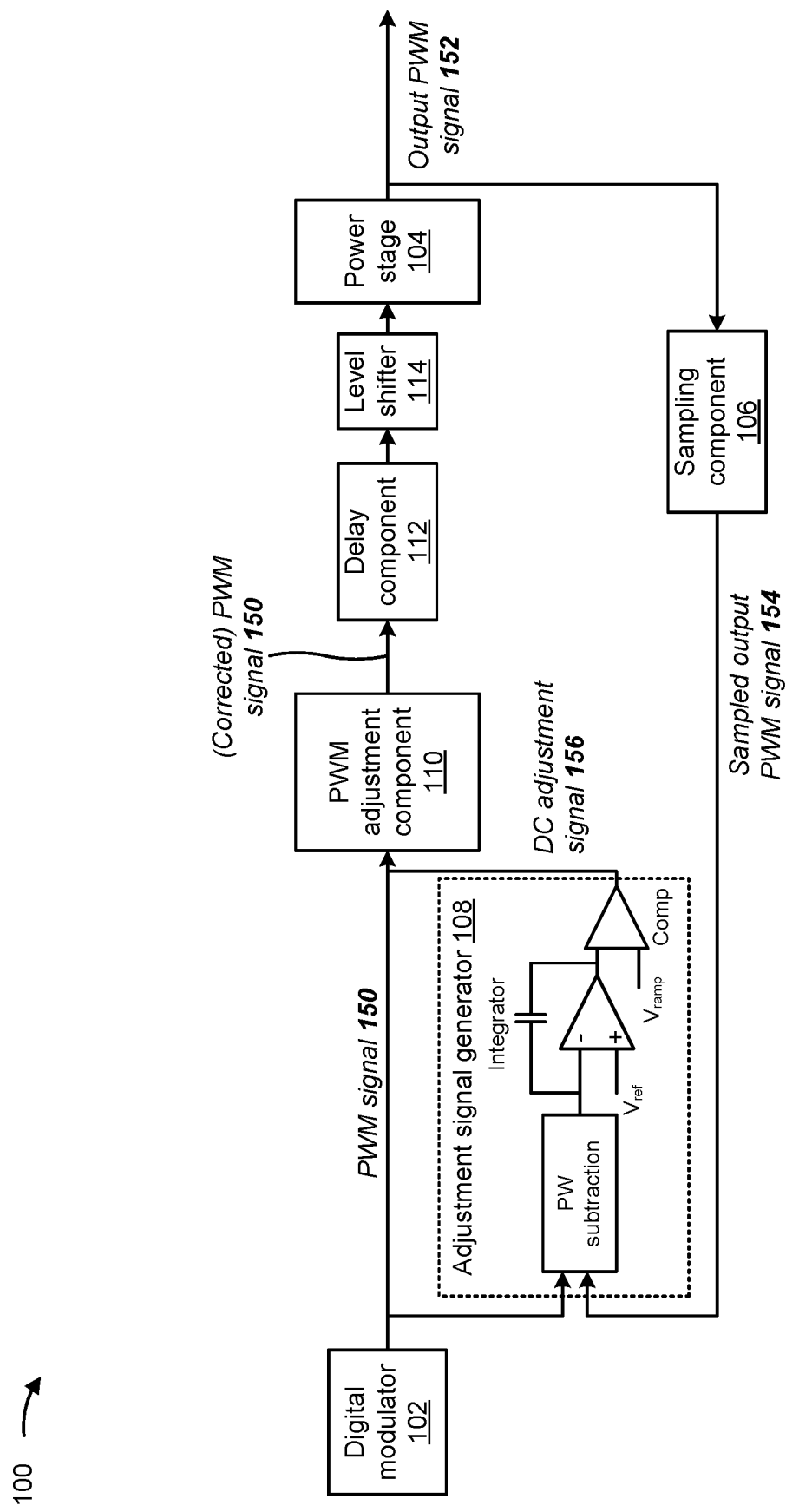
FIG. 1 is a diagram of an example of a device capable of duty cycle correction as described herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As described above, a driver circuit may generate a pair of differential signals used to drive another circuit component. For example, in a haptics application, a driver circuit may be configured to generate a pair of PWM signals that can be used to drive an LRA. In one example, the driver circuit comprises a digital modulator (e.g., such as a third order delta-sigma modulator with 4-bit digital PWM) that generates a pair of PWM signals, and the PWM signals are provided to respective high voltage power stages to generate a pair of output PWM signals that are used to drive the LRA. Here, each of the PWM signals generated by the digital modulator is processed separately in the driver circuit. That is, a first PWM signal of the pair of PWM signals that is generated by the digital modulator is processed using a first path of the driver circuit (e.g., a first set of circuit components) to generate a first PWM output signal, while a second PWM signal of the pair of PWM signals that is generated by the digital modulator is processed using a second (separate) path of the driver circuit (e.g., a second set of circuit components) to generate a second PWM output signal.

Notably, however, delay between the first and second paths of the driver circuit may be asymmetric, meaning that delays applied in association with generating the first and second output PWM signals differ, which causes distortion in a sine wave at the LRA. Thus, while the digital modulator can generate a nearly ideal sine wave, the asymmetry in delay causes distortion in the resulting sine wave. Further, a delay associated with a given path of the driver circuit is a function of a duty cycle and a direction of current flow through a power stage of the path. Fundamentally, the power stage is unable to faithfully reproduce the intended duty cycle. Conventionally, a closed loop feedback can be used to mitigate this duty cycle distortion issue by enabling adjustment of a power stage duty cycle dynamically. However, such a technique increases a size of the driver circuit (e.g., by requiring approximately 1 square millimeter (mm$^2$) of additional silicon area) and requiring additional current (e.g., an additional 1 milliamp (1 mA)).

Some aspects described herein provide techniques and apparatuses for duty cycle correction. In some aspects, a device (e.g., a driver circuit) comprises a digital modulator to generate a first PWM signal, a first power stage component to generate a first output PWM signal based on the first PWM signal, and a first sampling component to sample the first output PWM signal and generate a first sampled output PWM signal. The device may further include a first adjustment signal generator to generate a first duty cycle adjustment signal based on the first PWM signal and the first sampled output PWM signal, and a first PWM adjustment component to adjust a duty cycle of the first PWM signal based on the first duty cycle adjustment signal in association with correcting a duty cycle of the first output PWM signal to generate a corrected first PWM signal.

In operation, the device can measure a duty cycle in an output signal of the digital modulator and compare the duty cycle to a duty cycle in an output signal of the power stage and, in effect, modify a duty cycle of an input signal to the power stage such that the duty cycle of the output signal of the power stage matches an ideal duty cycle from the digital modulator. In this way, the power stage can reproduce the duty cycle of the digital modulator. In some aspects, the driver circuit may comprise components that provide such duty cycle correction for both paths of the driver circuit. As a result, asymmetry in delay between paths of the driver circuit may be reduced or eliminated, thereby reducing or eliminating distortion in a sine wave at the LRA. Additional details are provided below.

FIG. 1 is a diagram of an example of a device 100 capable of duty cycle correction as described herein. The device 100 may be included in, for example, a driver circuit, such as a driver circuit of a haptics module or another device that uses a digital modulator and in which analog distortion needs to be reduced, corrected, or mitigated. As shown in FIG. 1, the device 100 includes a digital modulator 102, a power stage 104, a sampling component 106, an adjustment signal generator 108, a PWM adjustment component 110, a delay component 112, and a level shifter 114. Components of the device 100 are described below, followed by description of an example of operation of the device 100.

The digital modulator 102 includes one or more components to generate one or more PWM signals 150. In some aspects, the digital modulator 102 may be configured to generate a pair of differential PWM signals 150 based on which a pair of differential output PWM signals 152 are to be generated in association with driving a load (e.g., an LRA not shown in FIG. 1). In some aspects, a duty cycle correction can be applied to a PWM signal 150 generated by the digital modulator 102 to generate a corrected PWM signal 150. In operation, a corrected PWM signal 150 is a PWM signal 150 to which a duty cycle correction has been applied. In some aspects, PWM provided by the digital modulator 102 may be controlled so as to control the driving of the load (e.g., such that an amplitude of a signal provided to the LRA is controlled based at least in part on the PWM provided by the digital modulator 102).

The power stage 104 includes one or more components to generate an output PWM signal 152 based on a PWM signal 150. In some aspects, the power stage 104 comprises one or more components associated with delivering power to a load (e.g., an LRA, not shown in FIG. 1). In some aspects, the power stage 104 can provide one or more functions, such as amplification, current control, voltage regulation, signal conditioning, or protection (e.g., to prevent overcurrent, overvoltage, or the like). Notably, the one or more components included in the power stage 104 may depend on the application in which the device 100 is used.

The sampling component 106 includes one or more components to sample an output PWM signal 152 and generate a sampled output PWM signal 154. In some aspects, the sampled output PWM signal 154 may be used in association with generating a duty cycle adjustment signal 156, as described below. In some aspects, the sampling component 106 includes a level shifter to apply a level shifter to the output PWM signal 152. That is, the sampling component 106 may comprise a level shifter that serves to convert (e.g., down-convert) a voltage level of the output PWM signal 152 from a second (e.g., higher) logic level to a first (e.g., lower) logic level (e.g., to ensure compatibility between different parts of the driver circuit 200 that operate at different voltage levels).

The adjustment signal generator 108 is a component to generate a duty cycle (DC) adjustment signal 156 based on a PWM signal 150 and the sampled output PWM signal 154. As shown in FIG. 1, the adjustment signal generator 108 may in some aspects include a set of components comprising a pulse width (PW) subtraction component, an integrator, and a comparator. The PW subtraction component includes one or more components to generate a signal indicating a difference between a pulse width of the PWM signal 150 and a pulse width of the sampled output PWM signal 154. The integrator includes a set of components to integrate the signal indicating the difference in the pulse width of the PWM signal 150 and the pulse width of the sampled output PWM signal 154 over time (e.g., such that the signal is converted to a voltage that is proportional to the integral of the signal). The comparator includes one or more components to generate the duty cycle adjustment signal 156 based on the output of the integrator. In some aspects, the duty cycle adjustment signal 156 indicates a difference between a duty cycle of the output PWM signal 152 and a duty cycle of the PWM signal 150. That is, the duty cycle adjustment signal 156 may serve to represent an amount by which the duty cycle of the output PWM signal 152 differs from the duty cycle of the PWM signal 150. Thus, the duty cycle adjustment signal 156 may in some aspects indicate a duty cycle correction that is to be applied to the PWM signal 150 (e.g., to generate the corrected PWM signal 150) such that the duty cycle of the output PWM signal 152 (e.g., the output of the power stage 104) matches an ideal duty cycle of the digital modulator 102.

The PWM adjustment component 110 includes one or more components to adjust a duty cycle of the PWM signal based on the duty cycle adjustment signal in association with correcting a duty cycle of the output PWM signal to generate a corrected PWM signal. In some aspects, the PWM adjustment component 110 includes one or more components capable of selectively adjusting (e.g., decreasing, increasing, leaving unchanged) a pulse width of the PWM signal 150. In some aspects, the PWM signal 150 and the duty cycle adjustment signal 156 may be provided to the PWM adjustment component 110, and the PWM adjustment component 110 may adjust a duty cycle of the PWM signal 150 based on the duty cycle adjustment signal 156 (e.g., by adjusting the pulse width in the PWM signal), thereby generating the corrected PWM signal 150.

The delay component 112 is a component to apply a delay to the (corrected) PWM signal 150. In some aspects, the delay component 112 may serve to introduce a controlled delay to the PWM signal 150. In some aspects, the delay component 112 may enabled further reduction of distortion by creating some amount of delay between the PWM signal 150 and the output PWM signal 152. This delay can be used to generate a larger adjustment signal for the PWM adjustment component 110 (e.g., an integrator), which can help to ensure that the PWM adjustment component 110 operates a desired state (e.g., not in a saturation state). In general, the delay component 112 can be used to manage timing of the PWM signal 150 such that the (corrected) PWM signal 150 exhibits a set of desired timing characteristics.

The level shifter 114 includes one or more components to apply a level shift to a PWM signal 150. In some aspects, the level shifter 114 serves to convert (e.g., up-convert) a voltage level of the PWM signal from one logic level to another (e.g., to ensure compatibility between different parts of the driver circuit 200 that operate at different voltage levels).

In an example operation of the device 100, a PWM signal 150 generated by the digital modulator 102 is to be level shifted by the level shifter 114 and processed by the power stage 104 to generate the output PWM signal 152. Here, the output PWM signal 152 (e.g., the output of the power stage 104) is provided to the sampling component 106, which samples the output PWM signal 152 and provides the sampled output PWM signal 154 to the adjustment signal generator 108. The adjustment signal generator 108 receives the PWM signal 150 and the sampled output PWM signal 154 and generates the duty cycle adjustment signal 156. Here, the duty cycle adjustment signal 156 indicates a difference between a duty cycle of the output PWM signal 152 and a duty cycle of the PWM signal 150 (e.g., a duty cycle error in the output PWM signal 152). The PWM adjustment component 110 receives the PWM signal 150 and the duty cycle adjustment signal 156, and adjusts the duty cycle of the PWM signal based on the duty cycle adjustment signal 156 to generate the corrected PWM signal 150. Here, the correction applied to the PWM signal 150 is used to correct the duty cycle error in the output PWM signal 152 (e.g., such that the duty cycle of the output PWM signal 152 matches an ideal duty cycle from the digital modulator 102).

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more functions described as being performed by another set of components shown in FIG. 1.

Figure 2:
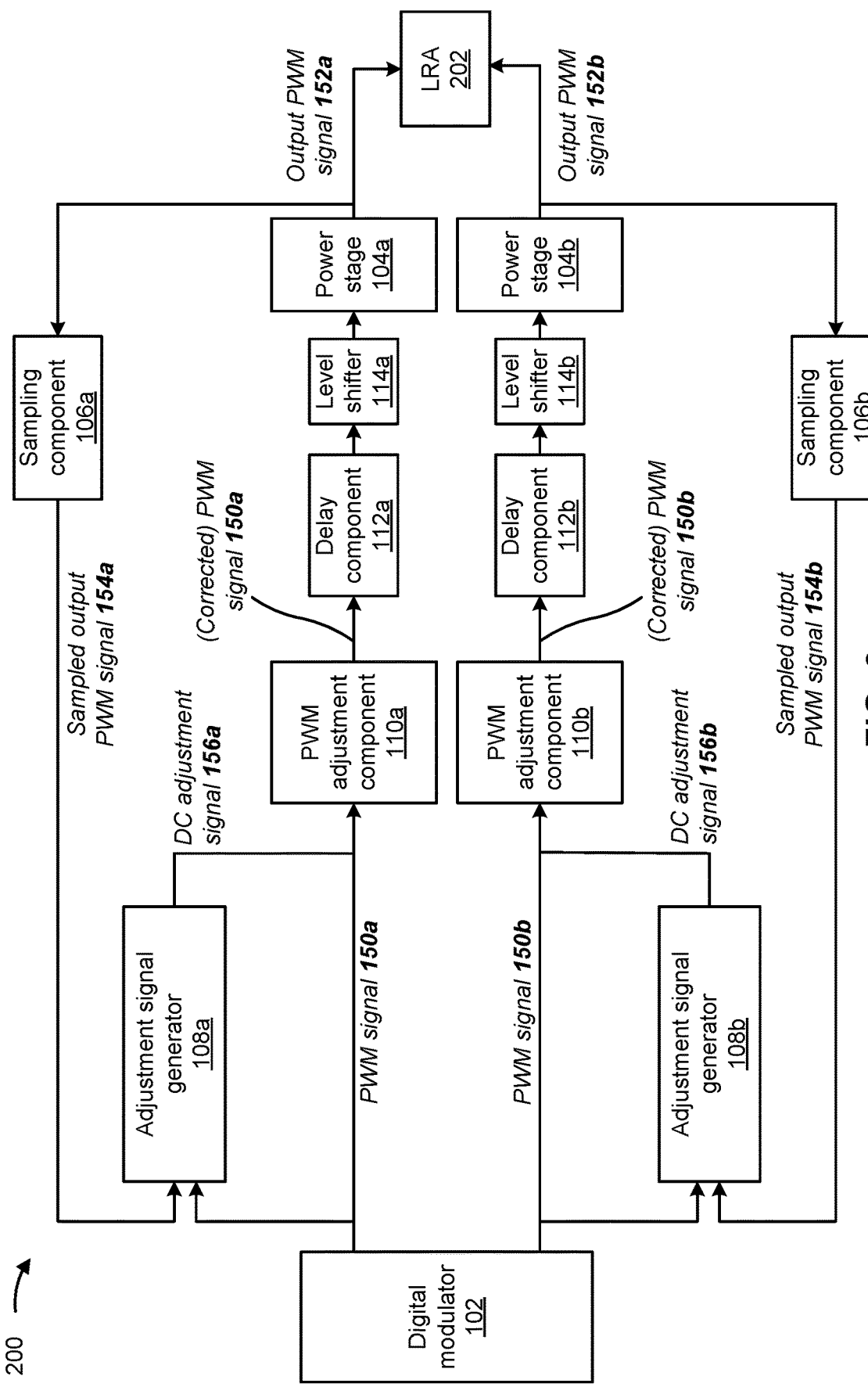
FIG. 2 is a diagram of an example driver circuit capable of providing duty cycle correction as described herein.

FIG. 2 is a diagram of an example driver circuit 200 capable of providing duty cycle correction as described herein. In the example shown in FIG. 2, the digital modulator 102 provides a pair of differential PWM signals 150 (e.g., PWM signal 150a and PWM signal 150b) and an LRA 202. Here, the LRA 202 is to be driven by a pair of differential output PWM signals 152 (e.g., output PWM signal 152a and output PWM signal 152b) generated based on the pair of differential PWM signals 150 provided by the digital modulator 102.

As illustrated in this example, the driver circuit 200 includes two (separate) sets of components, with each set of components including a respective power stage 104, sampling component 106, adjustment signal generator 108, PWM adjustment component 110, delay component 112, and level shifter 114. Here, each set of components forms a different path associated with providing duty cycle correction for a respective PWM signal 150. For example, the power stage 104a, the sampling component 106a, the adjustment signal generator 108a, the PWM adjustment component 110a, the delay component 112a, and the level shifter 114a serve to process and provide duty cycle correction for the PWM signal 150a, while the power stage 104b, the sampling component 106b, the adjustment signal generator 108b, the PWM adjustment component 110b, the delay component 112b, and the level shifter 114b serve to process and provide duty cycle correction for the PWM signal 150b. In this way, duty cycle correction can be independently provided for each of multiple PWM signals 150 provided by the digital modulator 102.

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more functions described as being performed by another set of components shown in FIG. 2.

Figure 3:
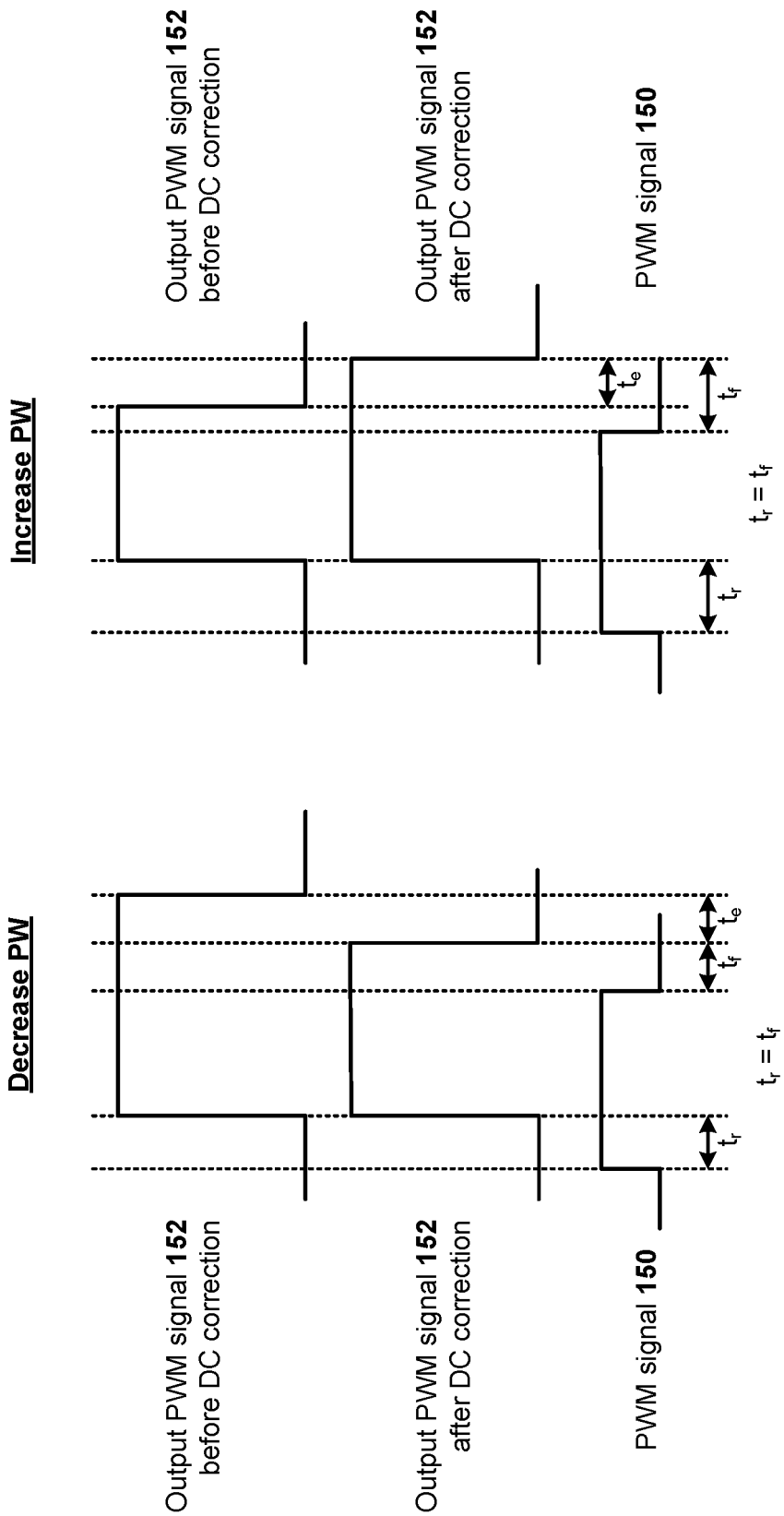
FIG. 3 illustrates examples associated with duty cycle correction as described herein.

FIG. 3 illustrates examples associated with duty cycle correction as described herein. The left diagram of FIG. 3 illustrates an example in which a duty cycle of a PWM signal 150 is decreased (e.g., by decreasing a pulse width of the PWM signal 150). The right diagram in FIG. 3 illustrates an example in which a duty cycle of a PWM signal 150 is increased (e.g., by increasing a pulse width of the PWM signal 150).

In practice, the duty cycle correction can be performed so that a falling edge time delay ($t_f$) (e.g., a delay between a falling edge of a given pulse of the PWM signal 150 and a falling edge of a corresponding pulse in an output PWM signal 152 after duty cycle correction) matches a rising edge time delay ($t_r$) (e.g., a delay between a rising edge of the given pulse of the PWM signal 150 and a rising edge of the corresponding pulse in an output PWM signal 152 after duty cycle correction). Here, the adjustment of the duty cycle of the PWM signal 150 can be performed so as to reduce or eliminate a duty cycle error ($t_e$) (e.g., a time difference between a falling edge of the given pulse of the output PWM signal 152 before duty cycle correction and an expected falling edge of the corresponding pulse in an output PWM signal 152) in an output PWM signal 152.

In the left diagram of FIG. 3, as indicated by the duty cycle error, the duty cycle in the output PWM signal 152 before duty cycle correction is larger than the duty cycle in the PWM signal 150. In this scenario, the pulse width of the PWM signal 150 can be decreased such that, after duty cycle correction, the falling edge time delay matches the rising edge time delay.

In the right diagram of FIG. 3, as indicated by the duty cycle error, the duty cycle in the output PWM signal 152 before duty cycle correction is smaller than the duty cycle in the PWM signal 150. In this scenario, the pulse width of the PWM signal 150 can be increased such that, after duty cycle correction, the falling edge time delay matches the rising edge time delay.

As indicated above, FIG. 3 is provided as an example. Other examples may differ from what is described with regard to FIG. 3.

Figure 4A:
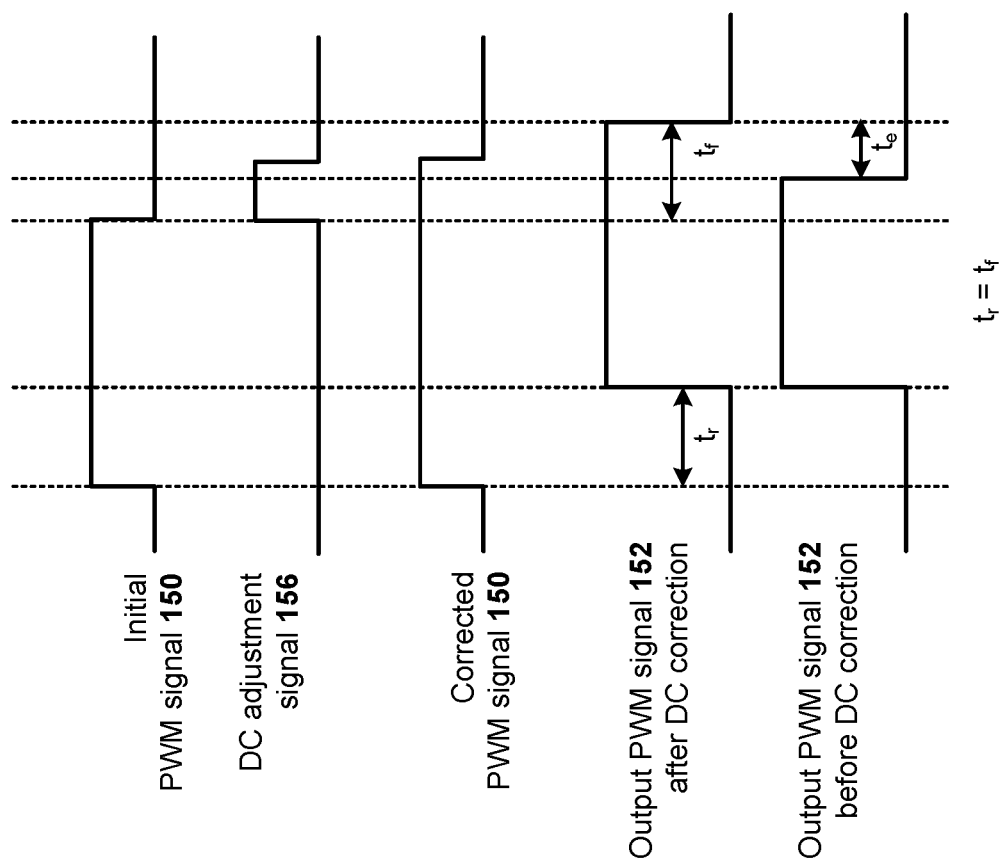
FIGS. 4A and 4B illustrate further examples associated with duty cycle correction as described herein.
Figure 4B:
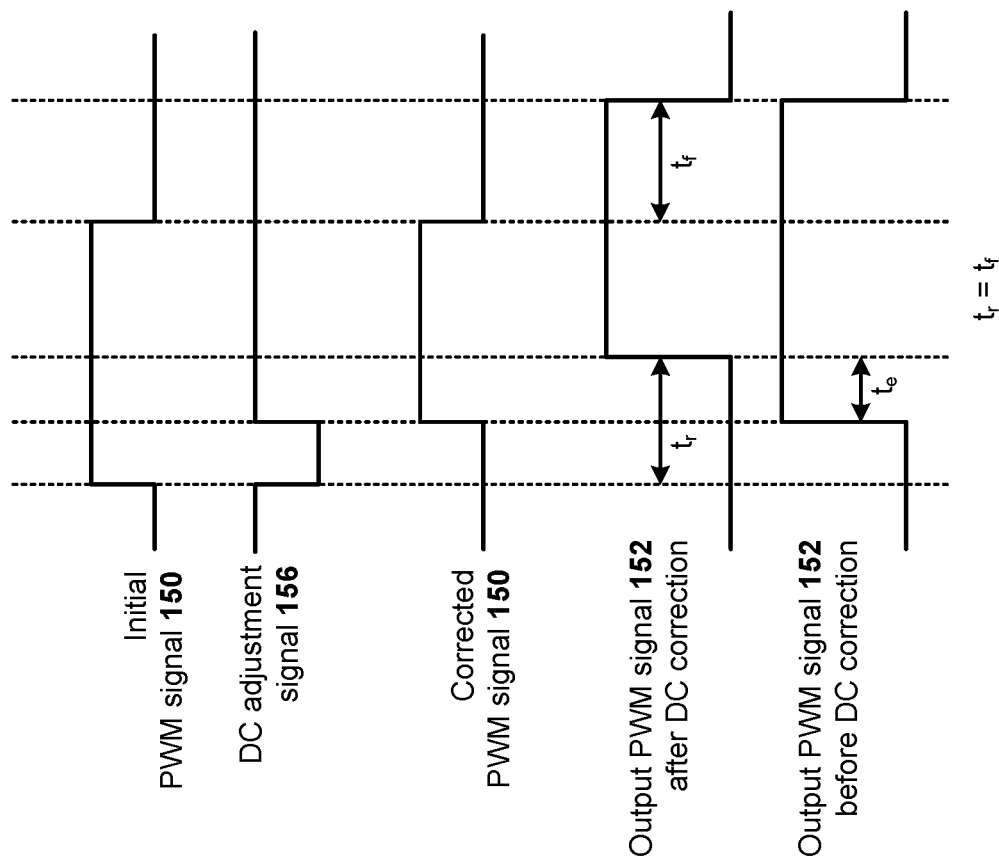

FIGS. 4A and 4B illustrate further examples associated with duty cycle correction as described herein.

In the example shown in FIG. 4A, as illustrated by comparing the lines corresponding to the initial PWM signal 150 and the output PWM signal 152 before duty cycle correction, a pulse width of the output PWM signal 152 before duty cycle correction is less than a pulse width of the initial PWM signal 150. Here, a device 100 may operate so as to generate a duty cycle adjustment signal 156 that serves to adjust the initial PWM signal 150 to generate the illustrated corrected PWM signal 150 that has an increased pulse width. As a result, the output PWM signal 152 after duty cycle correction has a desired pulse width (e.g., that matches that of the initial PWM signal 150) such that a falling edge time delay matches a rising edge time delay (e.g., $t_r=t_f$).

In the example shown in FIG. 4B, as illustrated by comparing the lines corresponding to the initial PWM signal 150 and the output PWM signal 152 before duty cycle correction, a pulse width in the output PWM signal 152 before duty cycle correction is greater than a pulse width of the initial PWM signal 150. Here, a device 100 may operate so as to generate a duty cycle adjustment signal 156 that serves to adjust the initial PWM signal 150 to generate the illustrated corrected PWM signal 150 that has a decreased pulse width. As a result, the output PWM signal 152 after duty cycle correction has a desired pulse width (e.g., that matches that of the initial PWM signal 150) such that a falling edge time delay matches a rising edge time delay (e.g., $t_r=t_f$).

As indicated above, FIGS. 4A and 4B are provided as examples. Other examples may differ from what is described with regard to FIGS. 4A and 4B.

Figure 5:
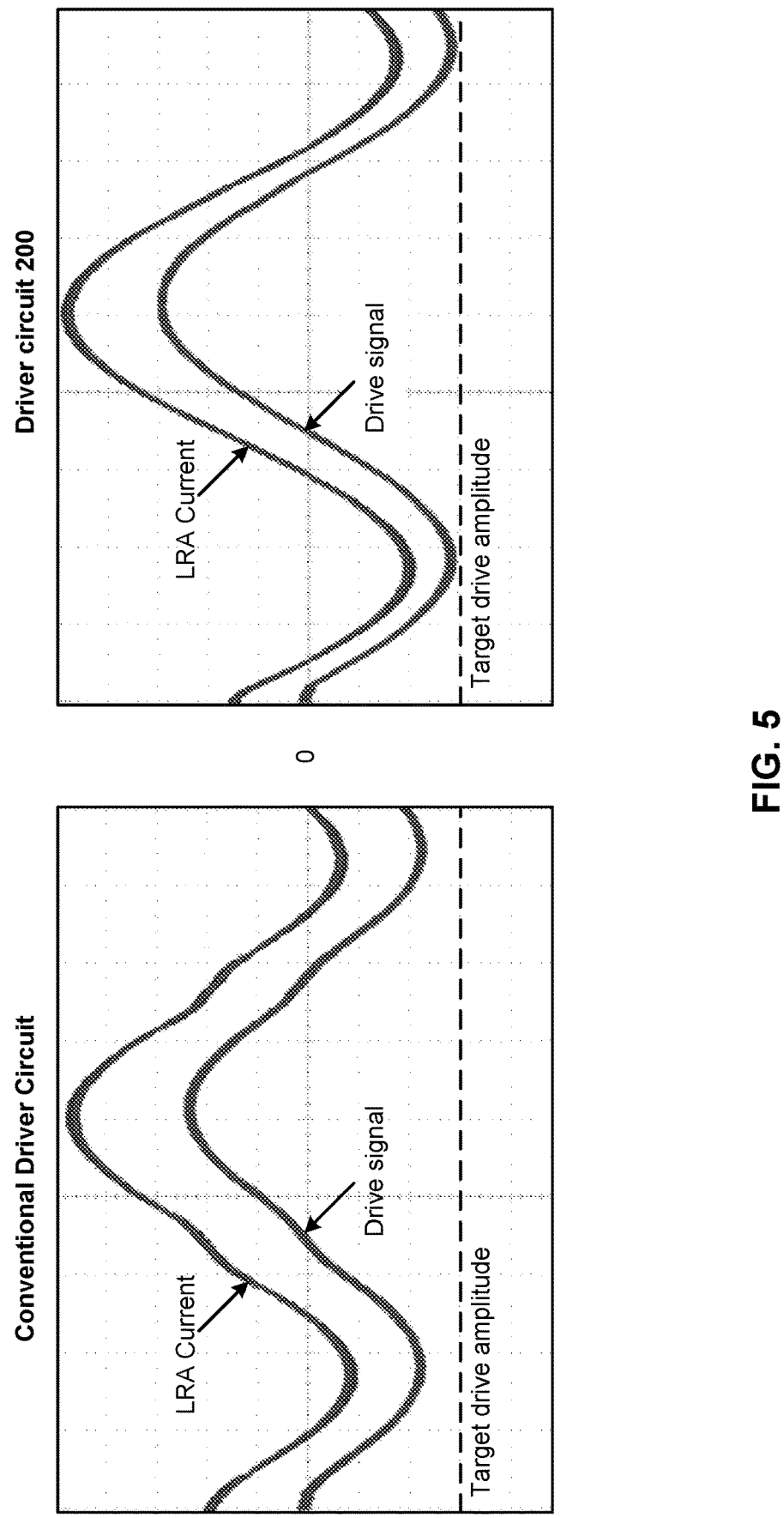
FIG. 5 illustrates an example of a reduction in distortion and improvement with respect to drive amplitude provided by the techniques and apparatuses for duty cycle correction described herein.

FIG. 5 illustrates an example of a reduction in distortion and improvement with respect to drive amplitude provided by the techniques and apparatuses for duty cycle correction described herein. The left diagram in FIG. 5 illustrates an example of sine waves corresponding to an LRA current and a drive signal as provided by a conventional driver circuit (e.g., without duty cycle correction), while the right diagram in FIG. 5 illustrates an example of sine waves corresponding to an LRA current and a drive signal as provided by the driver circuit 200 (e.g., for driving an LRA at 150 hertz (Hz) and a PWM frequency of 600 kHz). The drive signal in the right diagram corresponds to a difference between the output PWM signal 152a and the output PWM signal 152b (e.g., after low pass filtering).

As can be seen by comparing the left and right diagrams in FIG. 5, distortion in both the LRA current and the drive signal is reduced for the driver circuit 200 (e.g., the sine waves are comparatively smoother with respect to the driver circuit 200). Further, an actual amplitude of the drive signal for the driver circuit 200 better matches a target drive amplitude for the LRA (e.g., as compared to that of the conventional driver circuit).

As indicated above, FIG. 5 is provided as an example. Other examples may differ from what is described with regard to FIG. 5.

Figure 6:
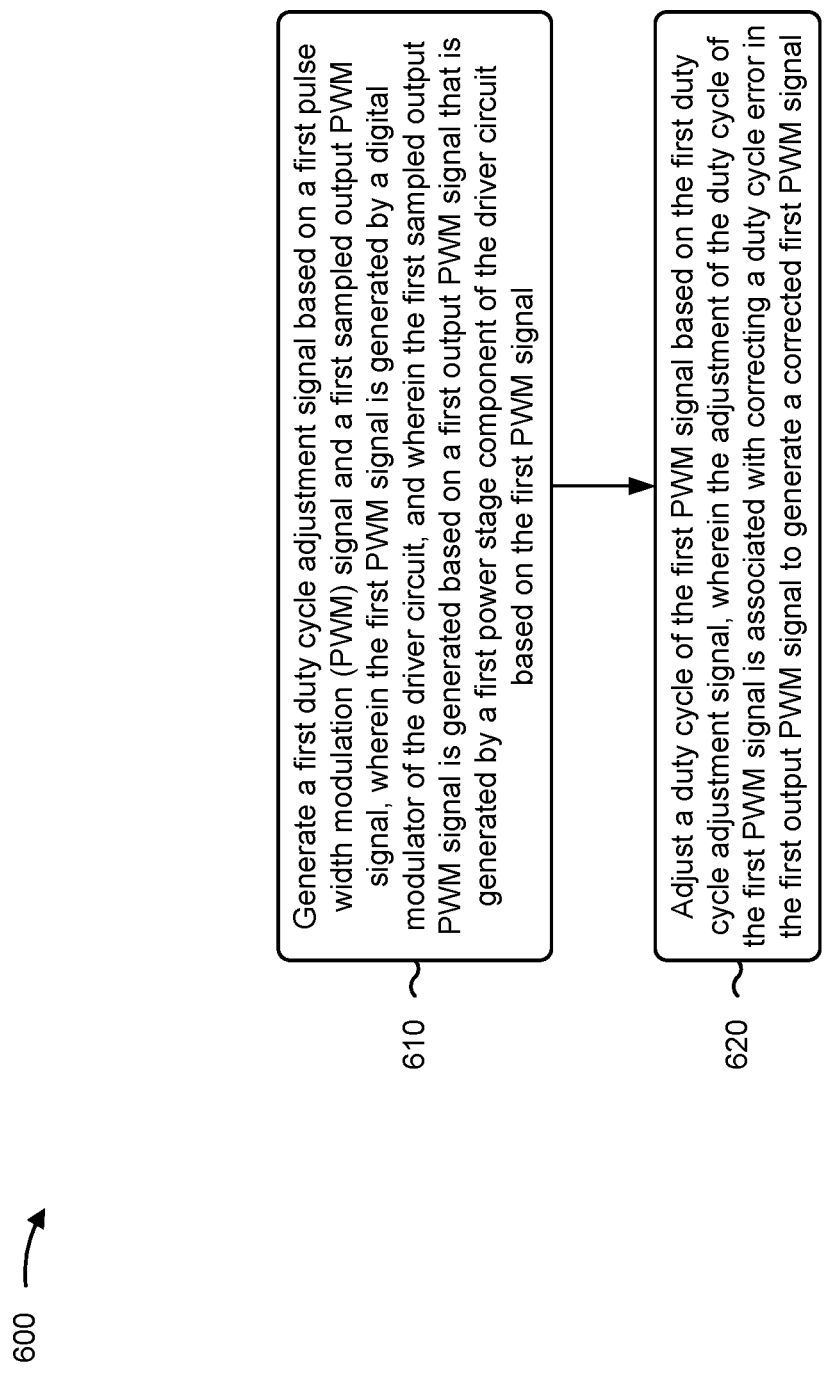
FIG. 6 is a flowchart of an example process associated with duty cycle correction, in accordance with the present disclosure.

FIG. 6 is a flowchart of an example process 600 associated with duty cycle correction, in accordance with the present disclosure. In some aspects, one or more process blocks of FIG. 6 are performed by one or more components of a driver circuit (e.g., a driver circuit 200 including one or more devices 100, or the like).

As shown in FIG. 6, process 600 may include generating a first duty cycle adjustment signal based on a first PWM signal and a first sampled output PWM signal, wherein the first PWM signal is generated by a digital modulator of the driver circuit, and wherein the first sampled output PWM signal is generated based on a first output PWM signal that is generated by a first power stage component of the driver circuit based on the first PWM signal (block 610). For example, a first adjustment signal generator (e.g., adjustment signal generator 108a) of the driver circuit may generate a first duty cycle adjustment signal (e.g., DC adjustment signal 156a) based on a first PWM signal (e.g., PWM signal 150a) and a first sampled output PWM signal (e.g., sampled output PWM signal 154a), wherein the first PWM signal is generated by a digital modulator (e.g., a digital modulator 102) of the driver circuit, and wherein the first sampled output PWM signal is generated based on a first output PWM signal (e.g., output PWM signal 152a) that is generated by a first power stage component (e.g., power stage 104a) of the driver circuit based on the first PWM signal, as described above.

As further shown in FIG. 6, process 600 may include adjusting a duty cycle of the first PWM signal based on the first duty cycle adjustment signal, wherein the adjustment of the duty cycle of the first PWM signal is associated with correcting a duty cycle error in the first output PWM signal to generate a corrected first PWM signal (block 620). For example, a first PWM adjustment component (e.g., PWM adjustment component 110a) of the driver circuit may adjust a duty cycle of the first PWM signal based on the first duty cycle adjustment signal, wherein the adjustment of the duty cycle of the first PWM signal is associated with correcting a duty cycle error in the first output PWM signal to generate a corrected first PWM signal (e.g., corrected PWM signal 150a), as described above.

Process 600 may include additional aspects, such as any single aspect or any combination of aspects described below and/or in connection with one or more other processes described elsewhere herein.

In a first aspect, the first duty cycle adjustment signal is generated based at least in part on determining a difference between a pulse width of the first PWM signal and a pulse width of the first sampled output PWM signal.

In a second aspect, alone or in combination with the first aspect, the first duty cycle adjustment signal indicates a difference between a duty cycle of the first output PWM signal and a duty cycle of the first PWM signal.

In a third aspect, alone or in combination with one or more of the first and second aspects, process 600 includes generating, by a second adjustment signal generator (e.g., adjustment signal generator 108b) of the driver circuit, a second duty cycle adjustment signal (e.g., DC adjustment signal 156b) based on a second PWM signal (e.g., PWM signal 150b) and a second sampled output PWM signal (e.g., sampled output PWM signal 154b), wherein the second PWM signal is generated by the digital modulator, and wherein the second sampled output PWM signal is generated based on a second output PWM signal (e.g., output PWM signal 152b) that is generated by a second power stage component (e.g., power stage 104b) of the driver circuit based on the second PWM signal, and adjusting, by a second PWM adjustment component (e.g., PWM adjustment component 110b) of the driver circuit, a duty cycle of the second PWM signal based on the second duty cycle adjustment signal, wherein the adjustment of the duty cycle of the second PWM signal is associated with correcting a duty cycle error in the second output PWM signal to generate a second corrected PWM signal (e.g., corrected PWM signal 150b).

In a fourth aspect, alone or in combination with one or more of the first through third aspects, the second duty cycle adjustment signal is generated based at least in part on determining a difference between a pulse width of the second PWM signal and a pulse width of the second sampled output PWM signal.

In a fifth aspect, alone or in combination with one or more of the first through fourth aspects, the second duty cycle adjustment signal indicates a difference between a duty cycle of the second output PWM signal and a duty cycle of the second PWM signal.

In a sixth aspect, alone or in combination with one or more of the first through fifth aspects, the first output PWM signal and the second output PWM signal are to drive an LRA (e.g., an LRA 202).

Although FIG. 6 shows example blocks of process 600, in some aspects, process 600 includes additional blocks, fewer blocks, different blocks, or differently arranged blocks than those depicted in FIG. 6. Additionally, or alternatively, two or more of the blocks of process 600 may be performed in parallel.

The following provides an overview of some Aspects of the present disclosure:

Aspect 1: A device, comprising: a digital modulator to generate a first pulse width modulation (PWM) signal; a first power stage component to generate a first output PWM signal based on the first PWM signal; a first sampling component to sample the first output PWM signal and generate a first sampled output PWM signal; a first adjustment signal generator to generate a first duty cycle adjustment signal based on the first PWM signal and the first sampled output PWM signal; and a first PWM adjustment component to adjust a duty cycle of the first PWM signal based on the first duty cycle adjustment signal in association with correcting a duty cycle of the first output PWM signal to generate a corrected first PWM signal.

Aspect 2: The device of Aspect 1, further comprising a delay component to apply a delay to the corrected first PWM signal.

Aspect 3: The device of any of Aspects 1-2, further comprising a level shifter to apply a level shift to the corrected first PWM signal.

Aspect 4: The device of any of Aspects 1-3, wherein the first sampling component comprises a level shifter to apply a level shift to the first output PWM signal.

Aspect 5: The device of any of Aspects 1-4, wherein the first duty cycle adjustment signal indicates a difference between a duty cycle of the first output PWM signal and a duty cycle of the first PWM signal.

Aspect 6: The device of any of Aspects 1-5, wherein the digital modulator is further to generate a second PWM signal, and the device further comprises: a second power stage component to generate a second output PWM signal based on the second PWM signal; a second sampling component to sample the second output PWM signal and generate a second sampled output PWM signal; a second adjustment signal generator to generate a second duty cycle adjustment signal based on the second PWM signal and the second sampled output PWM signal; and a second PWM adjustment component to adjust a duty cycle of the second PWM signal based on the second duty cycle adjustment signal in association with correcting a duty cycle of the second output PWM signal to generate a corrected second PWM signal.

Aspect 7: The device of Aspect 6, further comprising a delay component to apply a delay to the corrected second PWM signal.

Aspect 8: The device of Aspect 6, further comprising a level shifter to apply a level shift to the corrected second PWM signal.

Aspect 9: The device of Aspect 6, wherein the second sampling component comprises a level shifter to apply a level shift to the second output PWM signal.

Aspect 10: The device of Aspect 6, wherein the second duty cycle adjustment signal indicates a difference between a duty cycle of the second output PWM signal and a duty cycle of the second PWM signal.

Aspect 11: The device of Aspect 6, further comprising a linear resonant actuator (LRA) to receive the first output PWM signal and the second output PWM signal.

Aspect 12: A method, comprising: generating, by a first adjustment signal generator of a driver circuit, a first duty cycle adjustment signal based on a first pulse width modulation (PWM) signal and a first sampled output PWM signal, wherein the first PWM signal is generated by a digital modulator of the driver circuit, and wherein the first sampled output PWM signal is generated based on a first output PWM signal that is generated by a first power stage component of the driver circuit based on the first PWM signal; and adjusting, by a first PWM adjustment component of the driver circuit, a duty cycle of the first PWM signal based on the first duty cycle adjustment signal, wherein the adjustment of the duty cycle of the first PWM signal is associated with correcting a duty cycle error in the first output PWM signal to generate a corrected first PWM signal.

Aspect 13: The method of Aspect 12, wherein the first duty cycle adjustment signal is generated based at least in part on determining a difference between a pulse width of the first PWM signal and a pulse width of the first sampled output PWM signal.

Aspect 14: The method of any of Aspects 12-13, wherein the first duty cycle adjustment signal indicates a difference between a duty cycle of the first output PWM signal and a duty cycle of the first PWM signal.

Aspect 15: The method of any of Aspects 12-14, further comprising: generating, by a second adjustment signal generator of the driver circuit, a second duty cycle adjustment signal based on a second PWM signal and a second sampled output PWM signal, wherein the second PWM signal is generated by the digital modulator, and wherein the second sampled output PWM signal is generated based on a second output PWM signal that is generated by a second power stage component of the driver circuit based on the second PWM signal; and adjusting, by a second PWM adjustment component of the driver circuit, a duty cycle of the second PWM signal based on the second duty cycle adjustment signal, wherein the adjustment of the duty cycle of the second PWM signal is associated with correcting a duty cycle error in the second output PWM signal to generate a second corrected PWM signal.

Aspect 16: The method of Aspect 15, wherein the second duty cycle adjustment signal is generated based at least in part on determining a difference between a pulse width of the second PWM signal and a pulse width of the second sampled output PWM signal.

Aspect 17: The method of Aspect 15, wherein the second duty cycle adjustment signal indicates a difference between a duty cycle of the second output PWM signal and a duty cycle of the second PWM signal.

Aspect 18: The method of Aspect 15, wherein the first output PWM signal and the second output PWM signal are to drive a linear resonant actuator (LRA).

Aspect 19: A driver circuit, comprising: a digital modulator to generate a pulse width modulation (PWM) signal; a first level shifter to apply a level shift to the PWM signal to generate a first level-shifted PWM signal; a power stage component to generate an output PWM signal based on the first level-shifted PWM signal; a second level shifter and sampler to reverse the level-shift applied by the first level shifter and sample the output PWM signal to generate a sampled output PWM signal; an adjustment signal generator to generate a duty cycle adjustment signal based on a difference in a pulse width of the PWM signal and a pulse width of the sampled output PWM signal; and a PWM adjustment component to adjust a duty cycle of the PWM signal based on the duty cycle adjustment signal, wherein the adjustment of the duty cycle of the PWM signal is to reduce an error in a duty cycle of the output PWM signal to generate a corrected PWM signal.

Aspect 20: The driver circuit of Aspect 19, further comprising a delay component to apply a delay to the corrected PWM signal.

Aspect 21: A system configured to perform one or more operations recited in one or more of Aspects 1-20.

Aspect 22: An apparatus comprising means for performing one or more operations recited in one or more of Aspects 1-20.

Aspect 23: A non-transitory computer-readable medium storing a set of instructions, the set of instructions comprising one or more instructions that, when executed by a device, cause the device to perform one or more operations recited in one or more of Aspects 1-20.

Aspect 24: A computer program product comprising instructions or code for executing one or more operations recited in one or more of Aspects 1-20.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A device, comprising:
   a digital modulator to generate a first pulse width modulation (PWM) signal;
   a first power stage component to generate a first output PWM signal based on the first PWM signal;
   a first sampling component to sample the first output PWM signal and generate a first sampled output PWM signal;
   a first adjustment signal generator to generate a first duty cycle adjustment signal based on the first PWM signal and the first sampled output PWM signal, wherein the first duty cycle adjustment signal indicates a difference between a duty cycle of the first output PWM signal and a duty cycle of the first PWM signal; and
   a first PWM adjustment component to adjust a duty cycle of the first PWM signal based on the first duty cycle adjustment signal in association with correcting a duty cycle of the first output PWM signal to generate a corrected first PWM signal.

2. The device of claim 1, further comprising a delay component to apply a delay to the corrected first PWM signal.

3. The device of claim 1, further comprising a level shifter to apply a level shift to the corrected first PWM signal.

4. The device of claim 1, wherein the first sampling component comprises a level shifter to apply a level shift to the first output PWM signal.

5. The device of claim 1, wherein the digital modulator is further to generate a second PWM signal, and the device further comprises:
   a second power stage component to generate a second output PWM signal based on the second PWM signal;
   a second sampling component to sample the second output PWM signal and generate a second sampled output PWM signal;
   a second adjustment signal generator to generate a second duty cycle adjustment signal based on the second PWM signal and the second sampled output PWM signal; and
   a second PWM adjustment component to adjust a duty cycle of the second PWM signal based on the second duty cycle adjustment signal in association with correcting a duty cycle of the second output PWM signal to generate a corrected second PWM signal.

6. The device of claim 5, further comprising a delay component to apply a delay to the corrected second PWM signal.

7. The device of claim 5, further comprising a level shifter to apply a level shift to the corrected second PWM signal.

8. The device of claim 5, wherein the second sampling component comprises a level shifter to apply a level shift to the second output PWM signal.

9. The device of claim 5, wherein the second duty cycle adjustment signal indicates a difference between a duty cycle of the second output PWM signal and a duty cycle of the second PWM signal.

10. The device of claim 5, further comprising a linear resonant actuator (LRA) to receive the first output PWM signal and the second output PWM signal.

11. A method, comprising:
    generating, by a first adjustment signal generator of a driver circuit, a first duty cycle adjustment signal based on a first pulse width modulation (PWM) signal and a first sampled output PWM signal, wherein the first duty cycle adjustment signal indicates a difference between a duty cycle of the first output PWM signal and a duty cycle of the first PWM signal,
       wherein the first PWM signal is generated by a digital modulator of the driver circuit, and
       wherein the first sampled output PWM signal is generated based on a first output PWM signal that is generated by a first power stage component of the driver circuit based on the first PWM signal; and
    adjusting, by a first PWM adjustment component of the driver circuit, a duty cycle of the first PWM signal based on the first duty cycle adjustment signal,
       wherein the adjustment of the duty cycle of the first PWM signal is associated with correcting a duty cycle error in the first output PWM signal to generate a corrected first PWM signal.

12. The method of claim 11, wherein the first duty cycle adjustment signal is generated based at least in part on determining a difference between a pulse width of the first PWM signal and a pulse width of the first sampled output PWM signal.

13. The method of claim 11, further comprising:
    generating, by a second adjustment signal generator of the driver circuit, a second duty cycle adjustment signal based on a second PWM signal and a second sampled output PWM signal,
       wherein the second PWM signal is generated by the digital modulator, and
       wherein the second sampled output PWM signal is generated based on a second output PWM signal that is generated by a second power stage component of the driver circuit based on the second PWM signal; and
    adjusting, by a second PWM adjustment component of the driver circuit, a duty cycle of the second PWM signal based on the second duty cycle adjustment signal,
       wherein the adjustment of the duty cycle of the second PWM signal is associated with correcting a duty cycle error in the second output PWM signal to generate a second corrected PWM signal.

14. The method of claim 13, wherein the second duty cycle adjustment signal is generated based at least in part on determining a difference between a pulse width of the second PWM signal and a pulse width of the second sampled output PWM signal.

15. The method of claim 13, wherein the second duty cycle adjustment signal indicates a difference between a duty cycle of the second output PWM signal and a duty cycle of the second PWM signal.

16. The method of claim 13, wherein the first output PWM signal and the second output PWM signal are to drive a linear resonant actuator (LRA).

17. A driver circuit, comprising:
a digital modulator to generate a pulse width modulation (PWM) signal;
a first level shifter to apply a level shift to the PWM signal to generate a first level-shifted PWM signal;
a power stage component to generate an output PWM signal based on the first level-shifted PWM signal;
a second level shifter and sampler to reverse the level-shift applied by the first level shifter and sample the output PWM signal to generate a sampled output PWM signal;
an adjustment signal generator to generate a duty cycle adjustment signal based on a difference in a pulse width of the PWM signal and a pulse width of the sampled output PWM signal; and
a PWM adjustment component to adjust a duty cycle of the PWM signal based on the duty cycle adjustment signal,
wherein the adjustment of the duty cycle of the PWM signal is to reduce an error in a duty cycle of the output PWM signal to generate a corrected PWM signal.

18. The driver circuit of claim 17, further comprising a delay component to apply a delay to the corrected PWM signal.

19. The driver circuit of claim 17, wherein the duty cycle adjustment signal indicates a difference between a duty cycle of the output PWM signal and a duty cycle of the PWM signal.

20. The driver circuit of claim 17, wherein the digital modulator is further to generate a second PWM signal, and the driver circuit further comprises:
a second power stage component to generate a second output PWM signal based on the second PWM signal;
a second sampling component to sample the second output PWM signal and generate a second sampled output PWM signal;
a second adjustment signal generator to generate a second duty cycle adjustment signal based on the second PWM signal and the second sampled output PWM signal; and
a second PWM adjustment component to adjust a duty cycle of the second PWM signal based on the second duty cycle adjustment signal in association with correcting a duty cycle of the second output PWM signal to generate a corrected second PWM signal.

\* \* \* \* \*